United States Patent
Ryu et al.

(10) Patent No.: US 6,272,059 B1
(45) Date of Patent: Aug. 7, 2001

(54) BIT LINE SENSE-AMPLIFIER FOR A SEMICONDUCTOR MEMORY DEVICE AND A METHOD FOR DRIVING THE SAME

(75) Inventors: Douk Hyoun Ryu, Seoul; Yong Ho Seol, Ichon-shi, both of (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/468,786

(22) Filed: Dec. 21, 1999

(30) Foreign Application Priority Data

Dec. 24, 1998 (KR) .................................................. 98-58644

(51) Int. Cl.$^7$ .................................................. G11C 7/00
(52) U.S. Cl. .......................................... 365/205; 365/203
(58) Field of Search ...................................... 365/205, 203

(56) References Cited

U.S. PATENT DOCUMENTS

| | | | |
|---|---|---|---|
| 5,265,050 | 11/1993 | McLaury | 365/189.01 |
| 5,280,452 | 1/1994 | Dhong et al. | 365/205 |
| 5,303,196 | 4/1994 | Sang et al. | 365/205 |
| 5,315,555 | * 5/1994 | Choi | 365/207 |
| 5,402,378 | 3/1995 | Min et al. | 365/202 |
| 5,477,496 | 12/1995 | Tanaka et al. | |
| 5,499,211 | 3/1996 | Kirihata et al. | |
| 5,642,314 | 6/1997 | Yamauchi | |
| 5,761,132 | 6/1998 | Kim | 365/149 |
| 5,862,089 | 1/1999 | Raad et al. | 365/189.05 |

OTHER PUBLICATIONS

Yamazaki, Akira et al., *Large Scale Embedded DRAM Technology*, In: IEICE Trans. Electron., vol. E81–C, No. 5, May 1998, pp. 750–758.

* cited by examiner

*Primary Examiner*—David Nelms
*Assistant Examiner*—M. Tran
(74) *Attorney, Agent, or Firm*—Jacobson, Price, Holman & Stern, PLLC

(57) ABSTRACT

A bit line sense-amplifier for a semiconductor memory device and a method for driving the same do not apply a bit line precharge voltage by a switch in an equalization operation, perform an equalization operation by interconnecting a plurality of sense-amplifier lines, then perform a precharge operation by applying a bit line precharge voltage through NMOS transistor of the switch, increase a sensing speed by reducing a loading of a sense-amplifier, reduce a transient current, and minimize a power-consumption by performing a precharge operation after a bit line equalization.

10 Claims, 14 Drawing Sheets

US 6,272,059 B1

BIT LINE SENSE-AMPLIFIER FOR A SEMICONDUCTOR MEMORY DEVICE AND A METHOD FOR DRIVING THE SAME

BACKGROUND OF THE INVENTION

1. Field of the Invention

The present invention relates to a bit line sense-amplifier for a semiconductor memory device more particularly to a method for driving a bit line sense-amplifier for a semiconductor memory device which does not apply a bit line precharge voltage by using a switching means in an equalization operation, performs an equalization operation by interconnecting sense-amplifier lines, then performs a precharge operation by applying a bit line precharge voltage through NMOS transistor of the switching means, increases a sensing speed by reducing a loading of a sense-amplifier, decreases a transient current, and minimizes a power-consumption by performing a precharge operation after a bit line equalization.

2. Description of the Prior Art

FIG. 1 is a circuit diagram of a conventional bit line sense-amplifier.

Referring to FIG. 1, the conventional bit line sense-amplifier as of a folded bit line structure includes: a unit cell 1 which is connected between a first bit line BITH and a cell plate voltage terminal VCP, and is comprised of a first NMOS. transistor MN1 and a cell capacitance C1; a first line connector 2 which is comprised of second and third. NMOS transistors (MN2, MN3), and achieves a connection or a cut-off between first bit lines (BITH, /BITH) and sense-amplifier lines (SA, /SA) by using a first bit line cut-off signal BISH; a second line connector 3 which is comprised of 10th and 11th NMOS transistors (MN10, MN11), and achieves a connection or a cut-off between second bit lines (BITL, /BITL) and sense-amplifier lines (SA, /SA) by using a second bit line cut-off signal BISL; a sense-amplifier 5 which is comprised of first and second PMOS transistors (MP1, MP2) and 8th and 9th NMOS transistors (MN8, MN9), is connected sense-amplifier lines (SA, /SA), is driven by sense-amplifier control signals (RTO, /S), and performs a bit line sensing operation; and a data bus line connector 6 which is comprised of 12th and 13th NMOS transistors (MN12, MN13), is operated by a column selection signal YI_SEL, and achieves a connection or a cut-off between sense-amplifier lines (SA, /SA) and data bus lines (DB, /DB).

A bit line sensing operation of the conventional bit line sense-amplifier shown in FIG. 1 will be described with reference to FIGS. 2–3.

FIG. 2 is a circuit diagram showing a driving method of the conventional bit line sense-amplifier shown in FIG. 1, and FIG. 3 is a timing diagram of the conventional bit line sense-amplifier shown in FIG. 1.

As to a bit line sense-amplifier in an initial state as shown in FIG. 2(a), since the first and second bit line cut-off signals (BISH, BISL) are at a high level state as shown in FIGS. 3(a)–3(b), the first and second bit lines (BITH, /BITH, BITL, /BITL) are connected to the sense-amplifier lines (SA, /SA). Also, a bit line precharge voltage VBLP being a half Vcc power generator is applied to the above lines as shown in FIGS. 3(c), 3(h) and 3(i).

Then, as shown in FIG. 2(b), the second bit lines (BITL, /BITL) are isolated from the sense-amplifier lines (SA, /SA) by the second bit line cut-off signal BISL.

That is, as shown in FIGS. 3(b)–3(c), if the second bit line cut-off signal BISL and a bit line equalization signal BLP are changed from a high level state to a low level state, the fifth, sixth and seventh NMOS transistors (MN5, MN6, MN7) comprising a bit line equalization unit 4 and the 10th and 11th NMOS transistors (MN10, MN11) comprising the second line connector 3, thereby separating the second bit lines (BITL, /BITL) from the sense-amplifier lines (SA, /SA).

Then, a word line WL is selected as shown in FIG. 3(d), a voltage division occurs in the first bit line BITH shown in FIG. 2(c) and the sense-amplifier line SA shown in FIGS. 3(h) and 3(i).

After that, a sensing operation and a write-back operation to a storage node STR inside of the unit cell 1 are performed in the sense-amplifier 5.

That is, sense-amplifier control signals (RTO, /S) are applied as shown in FIGS. 3(f) and 3(g) so that an amplified signal is applied to the sense-amplifier lines (SA, /SA). As shown in FIG. 2(d), the amplified signal is write-back processed to a storage node inside of the unit cell 1.

In this course, the sense-amplifier lines (SA, /SA) and the first bit lines (BITH, /BITH) are interconnected so that a power-consumption occurs according to a loading of the first bit lines (BITH, /BITH). Here, the second and third NMOS transistors comprising the first line connector 2 are turned on because the first bit line cut-off signal BISH is at a high level state, so that the upper bit line is connected to the sense-amplifier lines.

Then, an equalization operation and a precharge operation of the first and second bit lines (BITH, /BITH, BITL, /BITL) and the sense-amplifier lines (SA, /SA) are performed at the same time.

Namely, as shown in FIGS. 3(d), 3(f) and 3(g), a word line WL is changed from a high level state to a low level state, and the sense-amplifier control signals (RTO, /S) are disabled with a half Vcc level. As shown in FIGS. 3(b) and 3(c), the second bit line cut-off signal BISL and a bit line equalization signal BLP are changed from a low level state to a high level state, so that the signals BISL and BLP are enabled. As shown in FIG. 2(e), the first and second bit lines (BITH, /BITH, BITL, /BITL) and the sense-amplifier lines (SA, /SA) are equalized and precharged.

In this course, since the equalization operation and the precharge operation are performed at the same time, a voltage of one sense-amplifier line SA between two sense-amplifier lines (SA, /SA) is amplified as a first Vcc voltage as shown in FIG. 3(h) by a sensing operation, and a voltage of the other sense-amplifier line (/SA) drops to a ground level voltage Vss, thereby occurring a power-consumption in a precharging process.

Accordingly, unnecessary power-consumption generated in a conventional sensing and precharging process should be removed, and increasing a sensing speed should minimize a current consumption in a chip operation.

To solve this problem, there is provided three kinds of methods in the present invention.

SUMMARY OF THE INVENTION

Accordingly, the present invention is that directed to a bit line sense-amplifier for a semiconductor memory device and a method for driving the same that substantially obviate one or more of the problems due to limitations and disadvantages of the related art.

It is an objective of the present invention to provide a it line sense-amplifier for a semiconductor memory device and a method for driving the same, which prevent a power-consumption by performing a precharge operation after an equalization operation in a precharge operation.

To achieve the above objective, a bit line sense-amplifier for a semiconductor memory device includes: first and second bit lines respectively having two bit lines, for transmitting a stored data to a memory cell; sense-amplifier lines for transmitting a data loaded on the first bit line to a sense-amplifier; first and second switches which are controlled by first and second control signals, and selectively connect two bit lines of the first bit line to the sense-amplifier lines; third and fourth switches which are controlled by third and fourth control signals, and selectively connect two bit lines of the second bit line to the sense-amplifier lines; and a fifth switch which is controlled by a fifth control signal, and selectively applies a bit line precharge voltage to the sense-amplifier lines.

A method for driving a bit line sense-amplifier includes the steps of: (a) interconnecting first and second bit lines and sense-amplifier lines, and applying a bit line precharge voltage to the sense-amplifier lines; (b) separating the second bit line from the sense-amplifier lines, and separating the sense-amplifier lines from the bit line precharge voltage; (c) selecting a desired memory cell, and transmitting a data to the bit lines and the sense-amplifier lines by a voltage division; (d) sensing a data transmitted to the sense-amplifier lines by a sense-amplifier, and performing a write-back operation to the selected memory cell; (e) performing an equalization by interconnecting the sense-amplifier lines; and (f) connecting the data lines with the sense-amplifier lines, and applying the bit line precharge voltage to the sense-amplifier lines.

Additional features and advantages of the invention will be set forth in the description, which follows, and in part will be apparent from the description, or may be learned by practice of the invention. The objective and other advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

Further objects and other advantages of the present invention will become apparent from the following description in conjunction with the attached drawings, in which.

DETAILED DESCRIPTION OF THE PREFERRED EMBODIMENT

A preferred embodiment of the present invention will now be described in detail with reference to the accompanying drawings.

Figure 4:
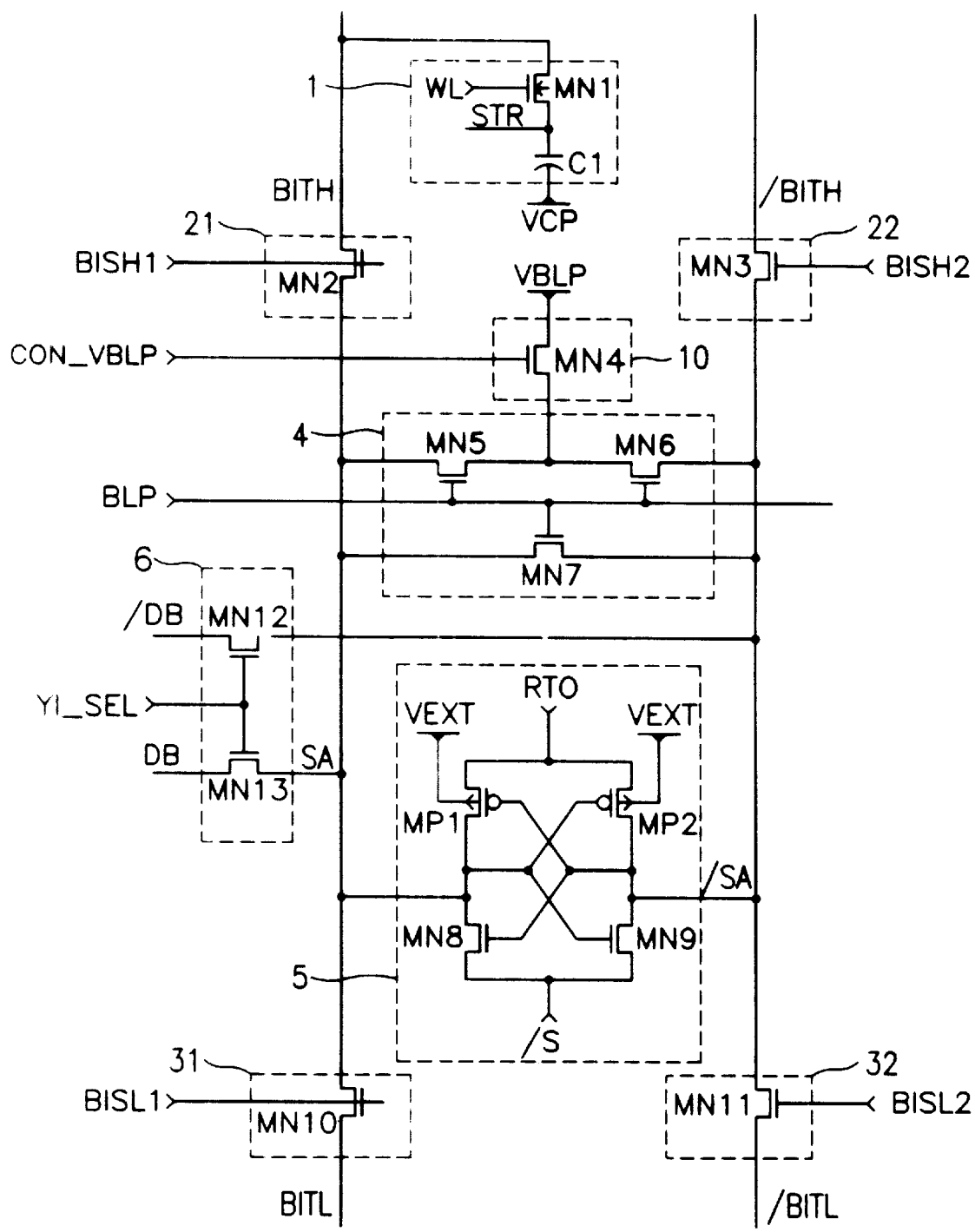
FIG. 4 is a circuit diagram of a bit line sense-amplifier according to the present invention.

FIG. 4 is a circuit diagram of a bit line sense-amplifier according to the present invention.

Figure 1:
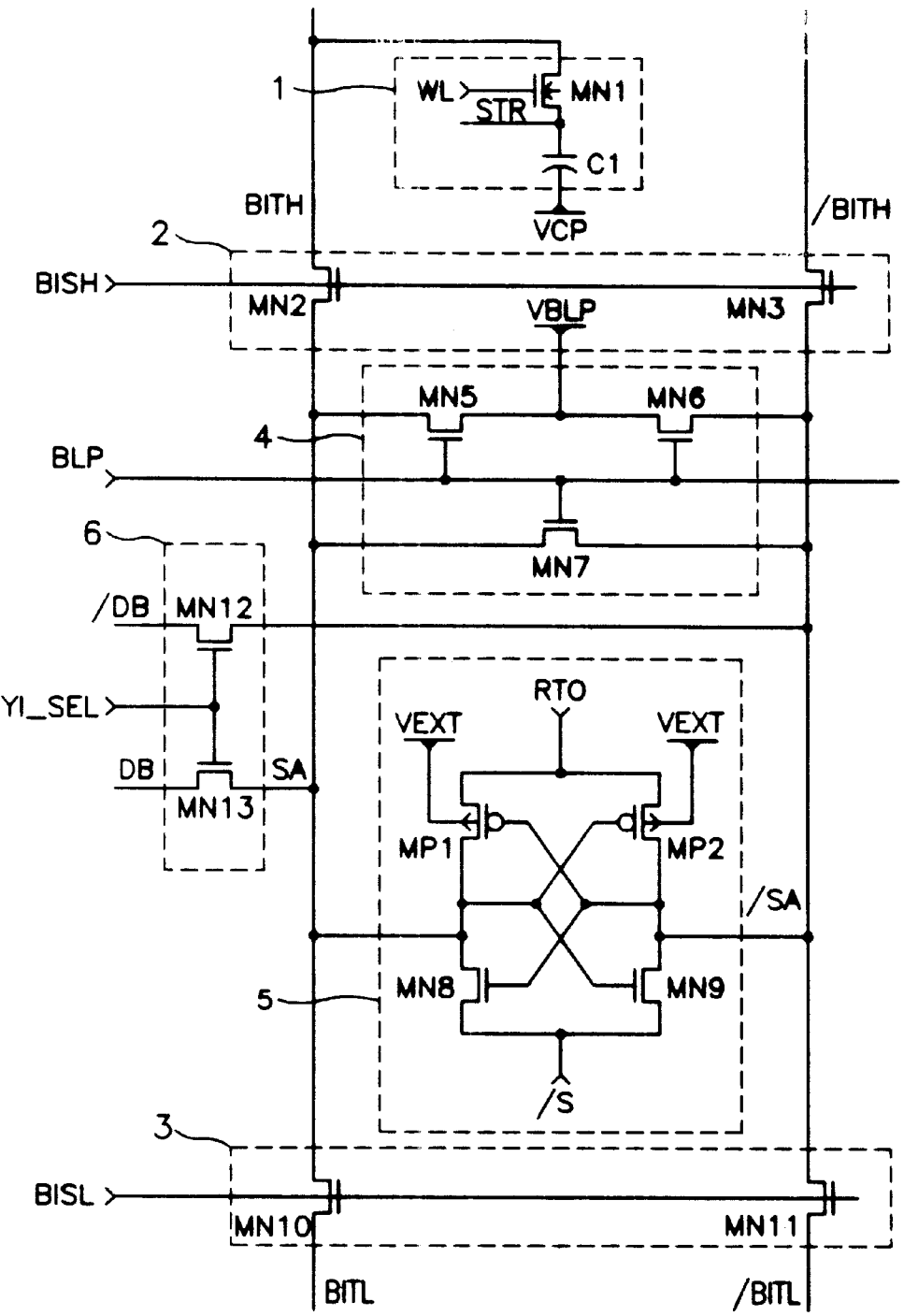
FIG. 1 is a circuit diagram of a conventional bit line sense-amplifier.
Figure 2:
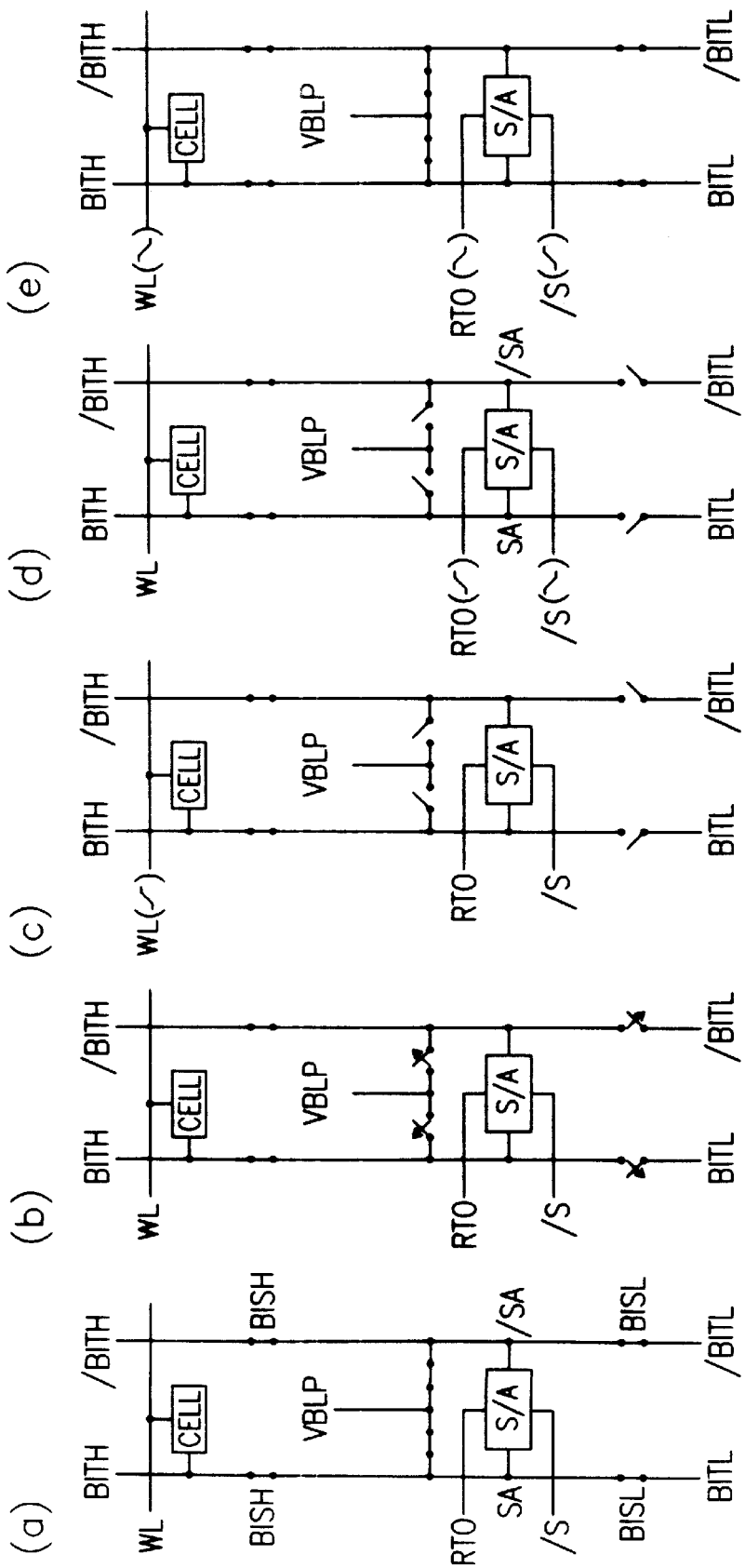
FIG. 2 is a circuit diagram showing a driving method of the conventional bit line sense-amplifier shown in FIG. 1.
Figure 3:
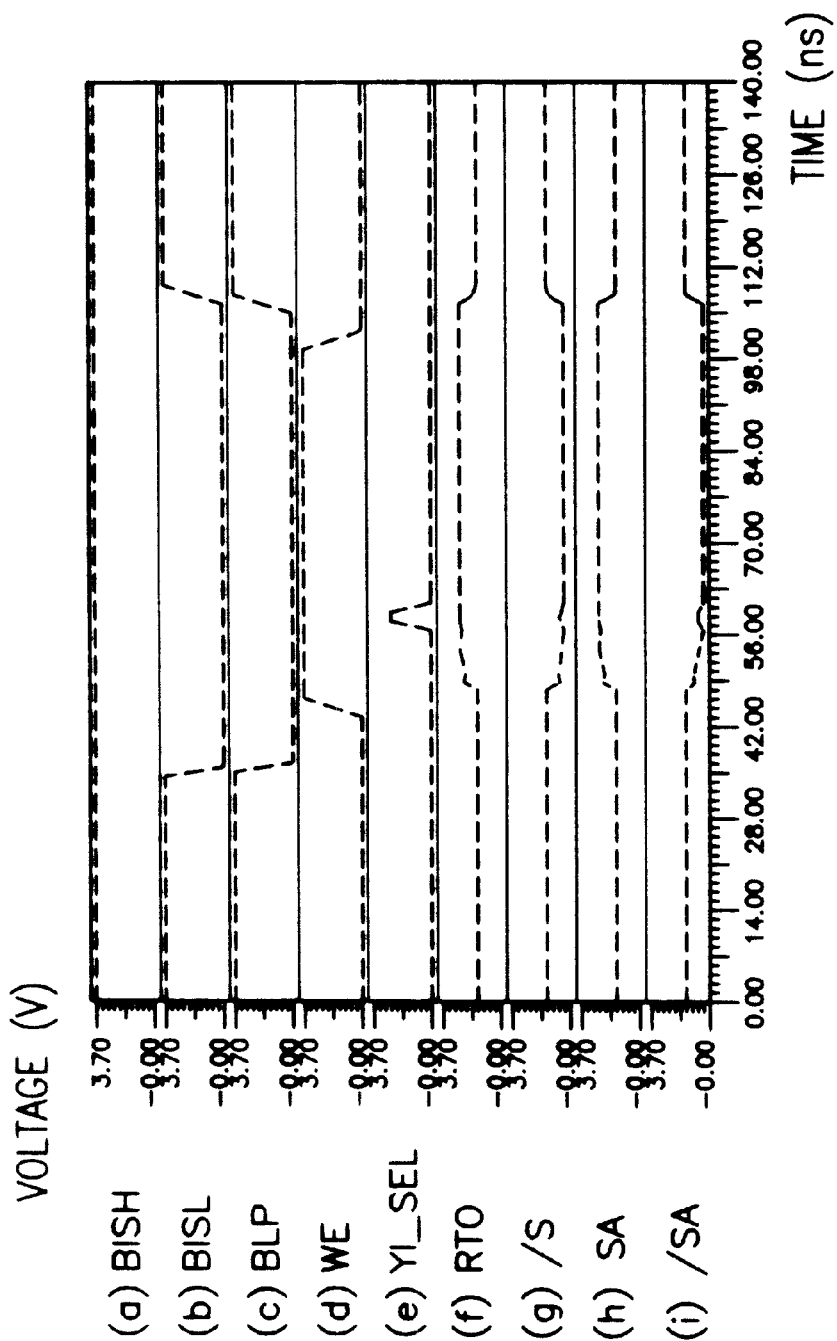
FIG. 3 is. a timing diagram of the conventional bit line sense-amplifier shown in FIG. 1.

A basic circuit configuration of the bit line sense-amplifier shown in FIG. 1 is the same as the conventional bit line sense-amplifier. An additional portion added to the circuit configuration of the conventional bit line sense-amplifier will be described below.

First, a bit line precharge unit 10 having NMOS transistor MN4 controlled by a bit line precharge signal CON_VBLP is added between the conventional bit line precharge voltage terminal VBLP and the conventional bit line equalization unit 4, so that a bit line equalization operation and a bit line precharge operation can be separately performed.

Also, the conventional bit line sense-amplifier simultaneously connects the first bit lines (BITH, /BITH) and the second bit lines (BITL, /BITL) to the sense-amplifier lines (SA, /SA) by making a first line connector 2 and a second line connector 3. But, the present invention includes four line connectors (21, 22, 31, 32), and makes NMOS transistors (MN2, MN3, MN10, MN11) be respectively controlled.

That is, by a first line connector 21, the first bit line BITH is connected to a sense-amplifier line SA, or is separated from the sense-amplifier line SA. And, by the second line connector 22, another first bit line /BITH is connected to another sense-amplifier line /SA, or is separated from another sense-amplifier line /SA.

In addition, by a third line connector 31, the second bit line BITL is connected to the sense-amplifier line SA, or is separated from the sense-amplifier line SA. And, by the fourth line connector 32, another second bit line /BITL is connected to another sense-amplifier line /SA, or is separated from another sense-amplifier line /SA.

A process from a sensing operation to a precharge operation according to three kinds of methods (i.e., first method, second method, and third method) will now be described with reference to the accompanying drawings.

First, the first method will now be described with reference to FIGS. 4–6.

Figure 5:
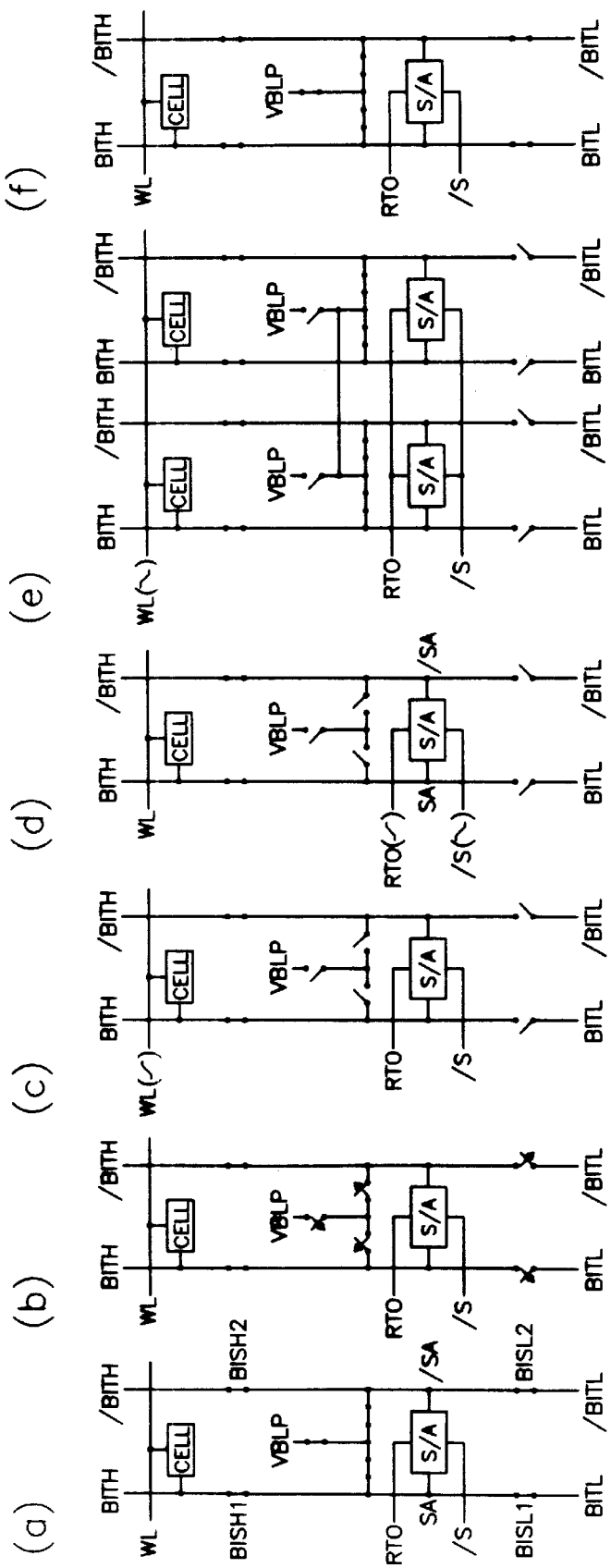
FIG. 5 is a circuit diagram showing a driving method of the bit line sense-amplifier shown in FIG. 4 in accordance with a first method of the present invention.
Figure 6:
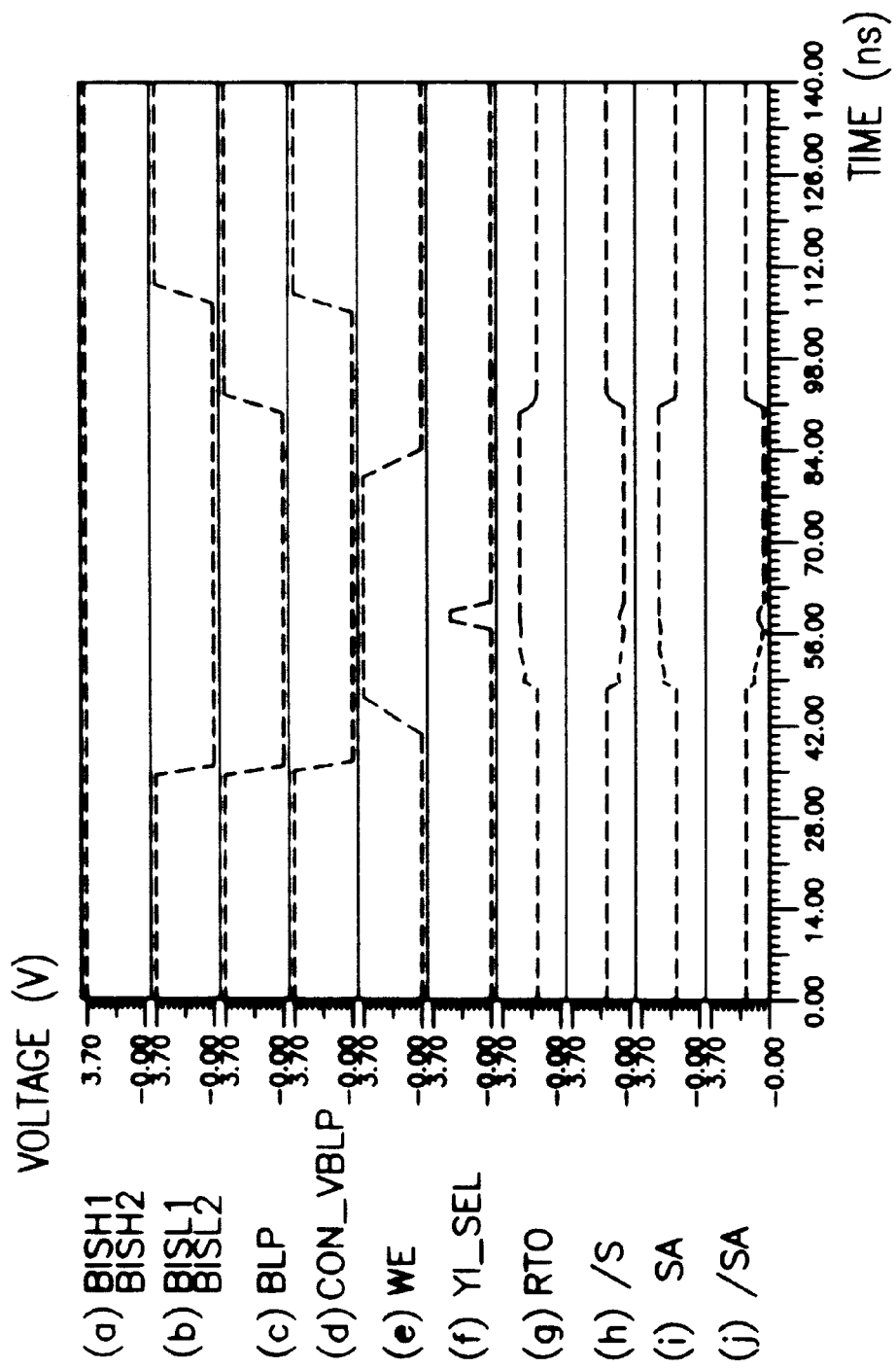
FIG. 6 is a timing diagram of the bit line sense-amplifier shown in FIG. 4 in accordance with a first method of the present invention.

FIG. 5 is a circuit diagram showing a driving method of the bit line sense-amplifier shown in FIG. 4 in accordance with a first method of the present invention; and FIG. 6 is a timing diagram of the bit line sense-amplifier shown in FIG. 4 in accordance with a first method of the present invention.

The first method separately performs a bit line equalization operation and a precharge operation after a sensing operation, so that a precharge operation is performed after the equalization operation, thereby preventing a power-consumption generated in the precharge operation.

In an initial state as shown in FIG. 5(a), the first and second bit line cut-off signals (BISH1, BISH2, BISL1, BISL2) are at a high level state as shown in FIGS. 6(a)–6(b), so that the first and second bit lines (BITH, /BITH, BITL, /BITL) are connected to the sense-amplifier lines (SA, /SA). As shown in FIGS. 6(c)–6(d), since a bit line equalization signal BLP and the bit line precharge signal CON_VBLP are at a high level state, the fifth, sixth, and seventh NMOS transistors (MN5, MN6, MN7) comprising a bit line equalization unit 4 and a fourth NMOS transistor MN4 comprising a bit line precharge unit 10 are turned on, a bit line precharge voltage VBLP being a half Vcc power generator is applied to the first and second bit lines (BITH, /BITH, BITL, /BITL) and the sense-amplifier lines (SA, /SA) as shown in FIGS. 6(i)–6(j).

After that, as shown in FIG. 5(b), the second bit lines (BITL, /BITL) are isolated from the sense-amplifier lines (SA, /SA) by the second bit line cut-off signals (BISL1, BISL2).

As shown in FIGS. 6(b) and 6(c), if the second bit line cut-off signals (BISL1, BISL2) and the bit line equalization signal BLP are changed from a high level state to a low level state, the fifth, sixth, and seventh NMOS transistors (MN5, MN6, MN7) comprising the bit line equalization unit 4 are turned off, the 10th NMOS transistor MN10 comprising the third line connector 31 and the 11th NMOS transistor MN11 comprising the fourth line connector 32 are turned off, and thus the second bit lines (BITL, /BITL) are isolated from the sense-amplifier lines (SA, /SA).

As shown in FIG. 6(d), since the bit line precharge signal CON_VBLP is changed from a high level state to a low level state, the fourth NMOS transistor MN4 comprising the bit line precharge unit 10 is turned off, thereby a bit line precharge voltage VBLP is not applied to the sense-amplifier lines (SA, /SA).

Then, a word line WL is selected as shown in FIG. 6(e), and a voltage division occurs in the first bit line BITH and the sense-amplifier line SA as shown in FIGS. 6(i)–6(j).

As shown in FIG. 5(d), a sensing operation of the sense-amplifier and a write-back operation to the unit cell 1 are performed.

Namely, sense-amplifier control signals (RTO, /S) are applied as shown in FIGS. 6(g)–6(h), an amplified signal is then applied to the sense-amplifier lines (SA, /SA), and the amplified signal is write-back processed to the unit cell 1.

Then, as shown in FIG. 5(e), an equalization operation about the sense-amplifier lines (SA, /SA) and the first bit lines (BITH, /BITH) is performed by a bit line equalization signal BLP.

Namely, under the condition the word line WL is disabled as shown in FIG. 6(e), if the bit line equalization signal BLP is enabled as shown in FIG. 6(c), the fifth, sixth and seventh NMOS transistors (MN5, MN6, MN7) comprising the bit line equalization unit 4 are turned on, thereby performing an equalization operation.

Accordingly, as shown in FIGS. 6(i)–6(j), the first bit lines (BITH, /BITH) and the sense-amplifier lines (SA, /SA) have a half Vcc voltage according to a voltage division.

After that, as shown in FIG. 5(f), a precharge operation is performed.

Namely, the 10th NMOS transistor MN10 comprising the third line connector 31 and the 11th NMOS transistor MN11 comprising the fourth line connector 21 are turned on by enabling second bit line cut-off signals (BISL1, BISL2) as shown in FIG. 6(b), thereby connecting the second bit lines (BITL, /BITL) to the sense-amplifier lines (SA, /SA). As shown in FIG. 6(d), enabling the bit line precharge signal CON_VBLP performs a precharge operation.

Therefore, a bit line precharge voltage VBLP is applied under the condition the sense-amplifier lines (SA, /SA) and the first bit lines (BITH, /BITH) are at a half Vcc level, so that a power-consumption is not generated in a precharge process.

As described above, the first method performs a precharge operation after performing an equalization operation, thus solves a power-consumption problem generated when the equalization operation and the precharge operation are performed at the same time.

Next, the second method will now be described with reference to FIGS. 4, 7, and 8. A sensing operation and a precharge operation will be described with reference to FIGS. 4, 7, and 8.

Figure 7:
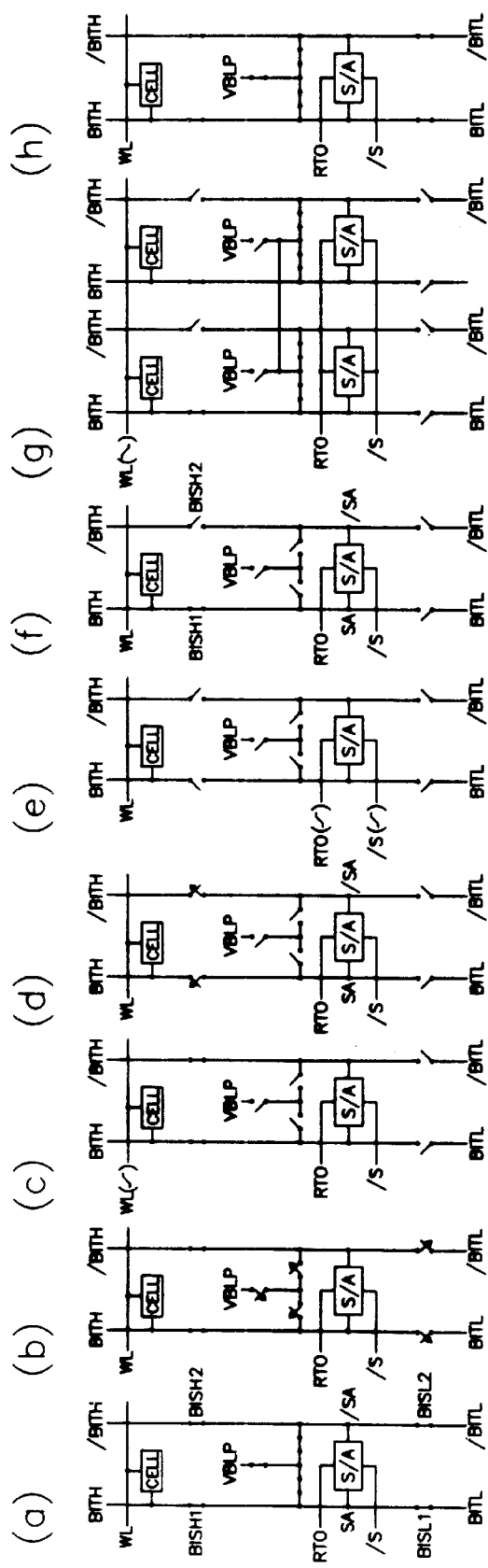
FIG. 7 is a circuit diagram showing a driving method of the bit line sense-amplifier shown in FIG. 4 in accordance with a second method of the present invention.
Figure 8:
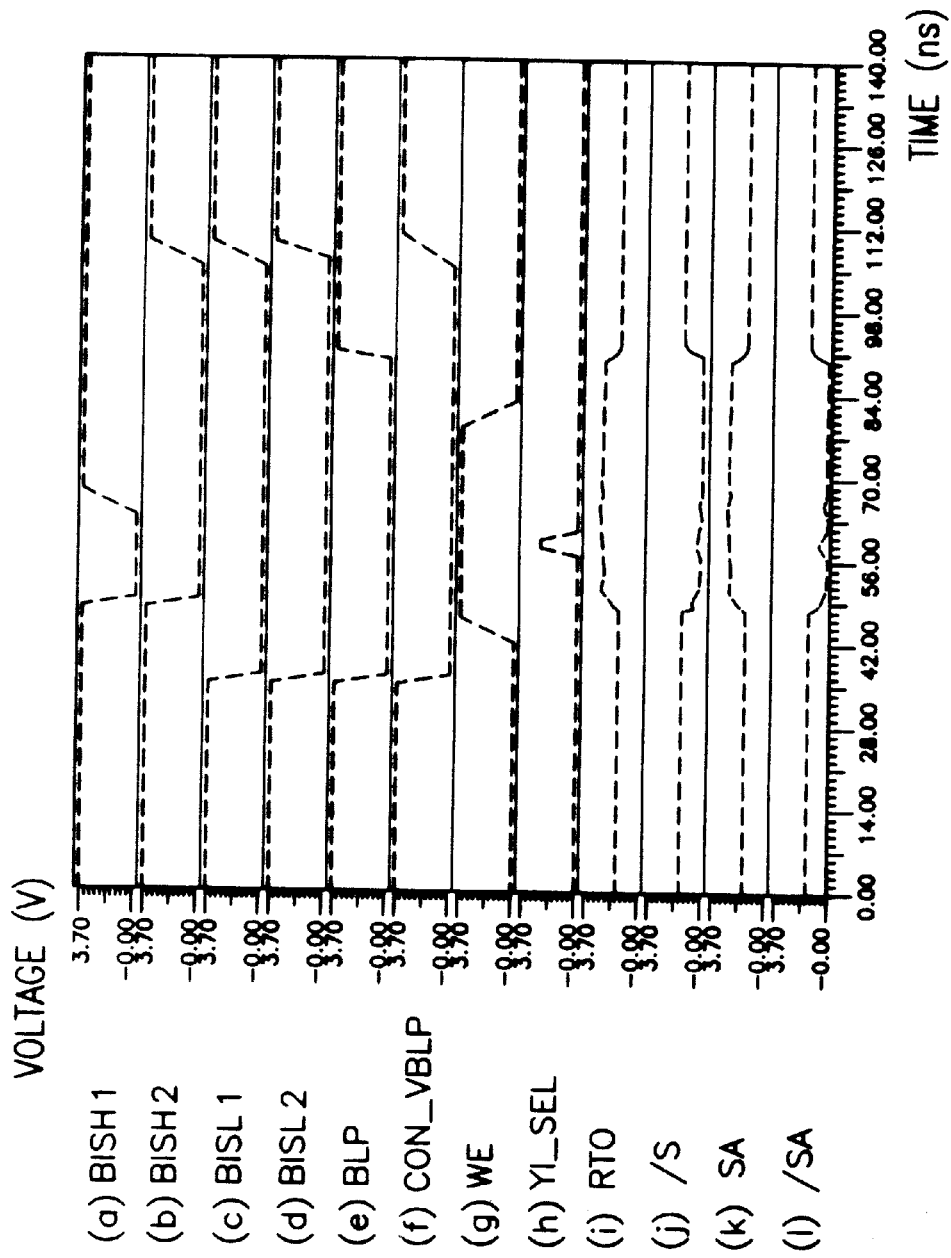
FIG. 8 is a timing diagram of the bit line sense-amplifier shown in FIG. 4 in accordance with a second method of the present invention.

FIG. 7 is a circuit diagram showing a driving method of the bit line sense-amplifier shown in FIG. 4 in accordance with a second method of the present invention; and FIG. 8 is a timing diagram of the bit line sense-amplifier shown in FIG. 4 in accordance with a second method of the present invention.

After completing a word line enable process, the second method separates the first line connector 21 and the second line connector 22 interconnecting the first bit lines (BITH, /BITH) and the sense-amplifier lines (SA, /SA) from the sense-amplifier lines (SA, /SA) through the first bit line cut-off signals (BISH1, BISH2), and then performs a sensing operation.

A process from the initial state to a word line enable step in the second method is the same as the first method.

In an initial state as shown in FIG. 7(a), the first and second bit line cut-off signals (BISH1, BISH2, BISL1, BISL2) are at a high level state as shown in FIGS. 8(a), 8(b), 8(c) and 8(d), so that the first and second bit lines (BITH, /BITH, BITL, /BITL) are connected to the sense-amplifier lines (SA, /SA).

As shown in FIGS. 8(e)–8(f), since a bit line equalization signal BLP and the bit line precharge signal CON_VBLP are at a high level state, the fifth, sixth, and seventh NMOS transistors (MN5, MN6, MN7) comprising a bit line equalization unit 4 and a fourth NMOS transistor MN4 comprising a bit line precharge unit 10 are turned on, a bit line precharge voltage VBLP being a half Vcc power generator is applied to the first and second bit lines (BITH, /BITH, BITL,/BITL) and the sense-amplifier lines (SA,/SA) as shown in FIGS. 8(k)–8(l).

After that, as shown in FIG. 7(b), the second bit lines (BITL, /BITL) are isolated from the sense-amplifier lines (SA, /SA) by the second bit line cut-off signals (BISL1, BISL2).

As shown in FIGS. 8(c), 8(d) and 8(e), if the second bit line cut-off signals (BISL1, BISL2) and the bit line equalization signal BLP are changed from a high level state to a low level state, the fifth, sixth, and seventh NMOS transistors (MN5, MN6, MN7) comprising the bit line equalization unit 4 are turned off, the 10th NMOS transistor MN10 comprising the third line connector 31 and the 11th NMOS transistor MN11 comprising the fourth line connector 32 are turned off, and thus the second bit lines (BITL, /BITL) are isolated from the sense-amplifier lines (SA, /SA).

As shown in FIG. 8(f), since the bit line precharge signal CON_VBLP is changed from a high level state to a low level state, the fourth NMOS transistor MN4 comprising the bit line precharge unit 10 is turned off, thereby a bit line precharge voltage VBLP is not applied to the sense-amplifier lines (SA, /SA) as shown in FIG. 7(b).

After that, as shown in FIG. 7(c), a word line WL is selected as shown in FIG. 8(g), and a voltage division is performed to the first bit line BITH and the sense-amplifier line SA as shown in FIGS. 8(k)–8(l).

Next, as shown in FIG. 7(d), since there is a voltage difference between the two sense-amplifier lines (SA, /SA) as shown in FIGS. 8(k)–8(l) because of a charge division, the first bit line cut-off signals (BISH1, BISH2) are disabled as shown in FIGS. 8(a)–8(b), and the second NMOS transistor MN2 comprising the first line connector 21 and the third NMOS transistor MN3 comprising the second line connector 22 are turned off, thereby separating the first bit lines (BITH, /BITH) from the sense-amplifier lines (SA, /SA).

Then, as shown in FIG. 7(e), sense-amplifier control signals (RTO, /S) are enabled as shown in FIGS. 8(i)–8(j), so that an amplified signal is applied to the sense-amplifier lines (SA, /SA).

In this course, a loading is lowered because the first bit lines (BITH, /BITH) are isolated from the sense-amplifier lines (SA, /SA), so that a sensing operation rapidly occurs and a transient current is decreased. In addition, a power line bouncing is decreased through a peak reduction of the transient current.

In the conventional bit line sense-amplifier structure, the first bit line /BITH is moved to a high or low level state according to a sense-amplifier operation, and is then moved to a half Vcc level. However, the present invention does not require this conventional operation by isolating the first bit line /BISH from the sense-amplifier line /SA.

After that, the second NMOS transistor MN2 comprising the first line connector 21 is turned on by enabling the first bit line cut-off signal BISH1 shown in FIG. 8(a), so that the first bit line BITH is connected to the sense-amplifier line SA. At this time, a write-back operation to the unit cell 1 is performed as shown in FIG. 7(f), and a potential level of the sense-amplifier line SA may be slightly lowered as shown in FIG. 8(k).

In a folded bit line structure, another first bit line /BITH to which a cell is not connected is not changed at a half Vcc level when a voltage division occurs by an enabled word line. Also, since the cell is not connected to another first bit line /BITH, there is no need to perform a write-back operation.

Then, as shown in FIG. 7(g), under the condition that the first bit line BITH is only connected to the sense-amplifier line SA, the sense-amplifier lines (SA, /SA) are mutually equalized.

Namely, the bit line equalization signal BLP shown in FIG. 8(e) is enabled, and thus the fifth, sixth, and seventh NMOS transistors (MN5, MN6, MN7) comprising the bit line equalization unit 4 are turned on, thereby interconnecting the sense-amplifier lines (SA, /SA).

In this case, the sense-amplifiers of 1K column are connected to another sense-amplifiers through NMOS transistor MN5 being an equalization transistor in one bank. A probability that a cell is at a high or low level state is 50%. Accordingly, a percentage of a high or low level state of cells in one bank is shown as a Gaussian distribution centering around 50%. For example, assuming that a high level state of 50% and a low level state of 50% are accurately made, the sense-amplifier lines (SA, /SA) and the first bit line BITH are equalized with a half Vcc voltage.

Assuming that the high level state of 50% and the low level state of 50% are not made, the sense-amplifier lines (SA, /SA) and the first bit line BITH may be equalized with a voltage slightly deviated from the half Vcc voltage.

After that, as shown in FIG. 7(h), a precharge operation is performed.

That is, the bit line cut-off signals (BISH2, BISL1, BISL2) are enabled as shown in FIGS. 8(b), 8(c), and 8(d), the third NMOS transistor MN3 comprising the second line connector 22, the tenth NMOS transistor MN10 comprising the third line connector 23, and the 11th NMOS transistor MN11 comprising the fourth line connector 32 are turned on, so that the first bit line /BITH is connected to the sense-amplifier line /SA and the second bit lines (BITL, /BITL) are connected to the sense-amplifier lines (SA, /SA).

As shown in FIG. 8(f), a bit line precharge signal CON_VBLP is enabled, the fourth NMOS transistor MN4 comprising the bit line precharge unit 10 is turned on, so that a bit line precharge voltage VBLP is applied to the bit lines (BITH, /BITH, BITL, /BITL) and the sense-amplifier lines (SA, /SA).

If an equalization operation is performed with a voltage slightly deviated from a half Vcc voltage in an equalization process, a unit at which this equalization operation occurs is precharged with a half Vcc voltage by the bit line precharge voltage VBLP, thereby preventing a power-consumption.

As described above, the second method connects only a bit line connected to a cell selected in a write-back process to the sense-amplifier lines, thereby performing a half write-back operation.

Next, the third method will now be described with reference to FIGS. 4, 9, and 10. A process from an initial state to a sensing operation of a sense-amplifier in the third is the same as the second method. But, the third method performs a full write-back operation.

Figure 9:
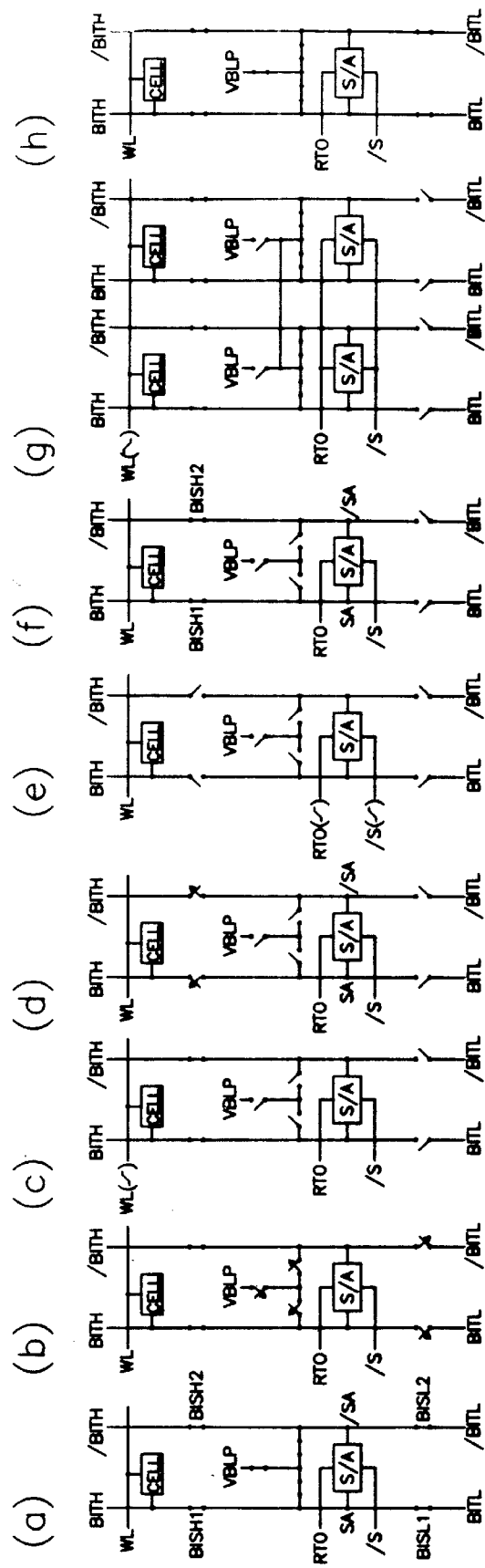
FIG. 9 is a circuit diagram showing a driving method of the bit like sense-amplifier shown in FIG. 4 in accordance with a third method of the present invention.
Figure 10:
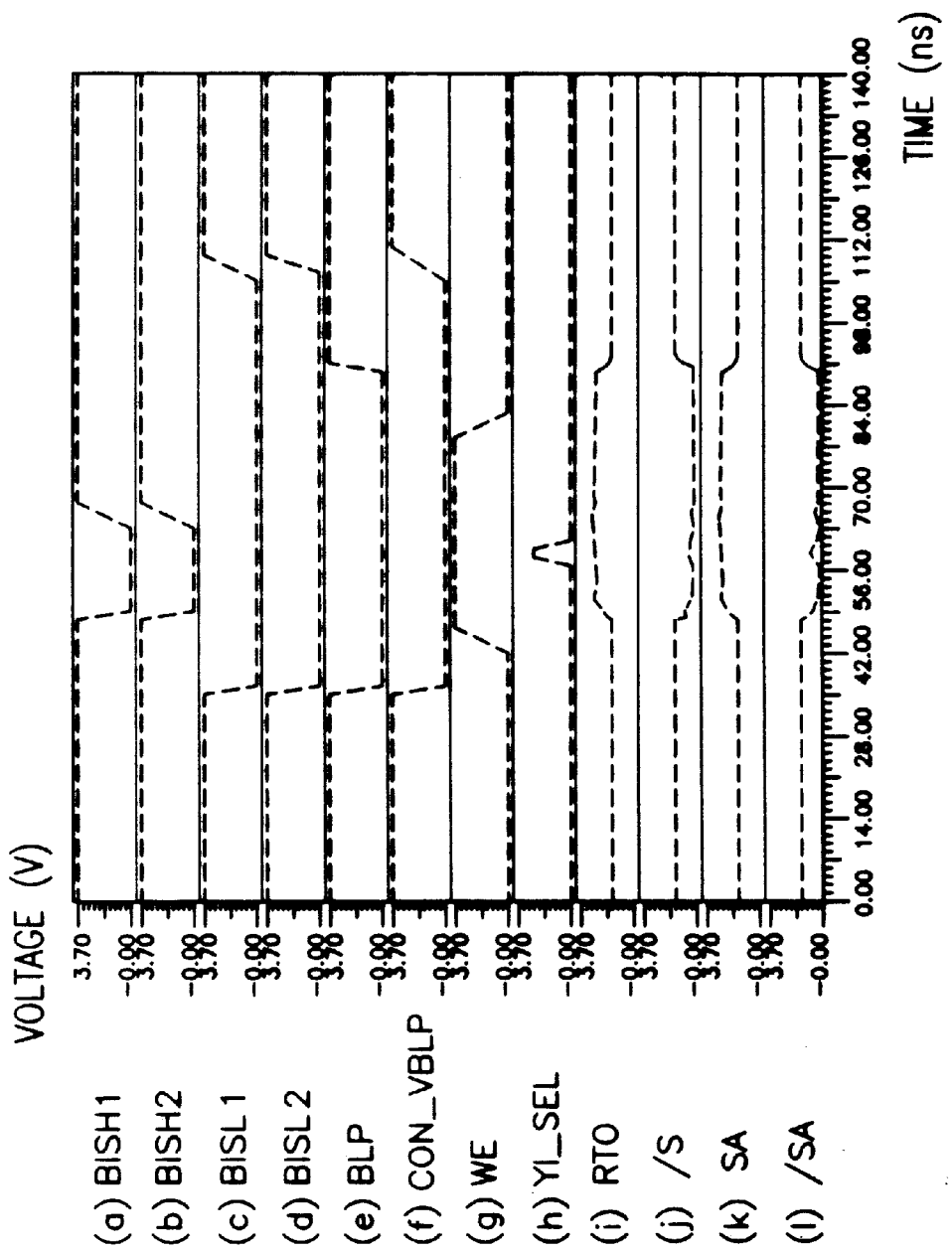
FIG. 10 is a timing diagram of the bit line sense-amplifier shown in FIG. 4 in accordance with a third method of the present invention.

FIG. 9 is a circuit diagram showing a driving method of the bit line sense-amplifier shown in FIG. 4 in accordance with a third method of the present invention; and FIG. 10 is a timing diagram of the bit line sense-amplifier shown in FIG. 4 in accordance with a third method of the present invention.

In an initial state as shown in FIG. 9(a), the first and second bit line cut-off signals (BISH1, BISH2, BISL1, BISL2) are at a high level state as shown in FIGS. 10(a), 10(b), 10(c) and 10(d), so that the first and second bit lines (BITH, /BITH, BITL, /BITL) are connected to the sense-amplifier lines (SA, /SA).

As shown in FIGS. 10(e)–10(f), since a bit line equalization signal BLP and the bit line precharge signal CON_VBLP are at a high level state, the fifth, sixth, and seventh NMOS transistors (MN5, MN6, MN7) comprising a bit line equalization unit 4 and a fourth NMOS transistor MN4 comprising a bit line precharge unit 10 are turned on, a bit line precharge voltage VBLP being a half Vcc power generator is applied to the first and second bit lines (BITH, /BITH, BITL, /BITL) and the sense-amplifier lines (SA, /SA) as shown in FIGS. 10(k)–10(l).

After that, as shown in FIG. 9(b), the second bit lines (BITL, /BITL) are isolated from the sense-amplifier lines (SA, /SA) by the bit line cut-off signals (BISL1, BISL2).

As shown in FIGS. 10(c), 10(d) and 10(e), if the bit line cut-off signals (BISL1, BISL2) and the bit line equalization signal BLP are changed from a high level state to a low level state, the fifth, sixth, and seventh NMOS transistors (MN5, MN6, MN7) comprising the bit line equalization unit 4 are turned off, the 10th NMOS transistor MN10 comprising the third line connector 31 and the 11th NMOS transistor MN11 comprising the fourth line connector 32 are turned off, and thus the second bit lines (BITL, /BITL) are isolated from the sense-amplifier lines (SA, /SA).

As shown in FIG. 10(f), since the bit line precharge signal CON_VBLP is changed from a high level state to a low level state, the fourth NMOS transistor MN4 comprising the bit line precharge unit 10 is turned off, thereby a bit line precharge voltage VBLP is not applied to the sense-amplifier lines (SA, /SA).

After that, as shown in FIG. 9(c), a word line WL is selected as shown in FIG. 10(g), and a voltage division is performed to the first bit line BITH and the sense-amplifier line SA as shown in FIGS. 10(k) and 10(l).

Next, as shown in FIG. 9(d), since there is a voltage difference between the two sense-amplifier lines (SA, /SA) as shown in FIGS. 10(k)–10(l) because of a voltage division, the bit line cut-off signals (BISH1, BISH2) are disabled as shown in FIGS. 10(a)–10(b), and the second NMOS transistor MN2 comprising the first line connector 21 and the third NMOS transistor MN3 comprising the second line connector 22 are turned off, thereby separating the first bit lines (BITH, /BITH) from the sense-amplifier lines (SA, /SA).

Then, as shown in FIG. 9(e), sense-amplifier control signals (RTO, /S) are enabled as shown in FIGS. 10(i)–10(j), so that an amplified signal is applied to the sense-amplifier lines (SA, /SA).

At this time, a loading is lowered because the first bit lines (BITH, /BITH) are isolated from the sense-amplifier lines (SA, /SA), so that a sensing operation rapidly occurs and a transient current is decreased. In addition, a power line bouncing is reduced through a peak reduction of the transient current.

In the conventional bit line sense-amplifier structure, the first bit line /BITH is moved to a high or a low level state according to a sense-amplifier operation, and is then moved to a half Vcc level. The present invention prevents does not require this conventional operation by isolating the first bit line /BISH from the sense-amplifier line, thereby preventing an unnecessary current-consumption.

After that, the second NMOS transistor MN2 comprising the first line connector 21 and the third NMOS transistor MN3 comprising the second line connector 22 are turned on by enabling the first bit line cut-off signals (BISH1, BISH2) shown in FIGS. 10(a)–10(b), so that the first bit lines (BITH, /BITH) are connected to the sense-amplifier lines (SA, /SA). At this time, a write-back operation to the unit cell 1 is performed as shown in FIG. 10(k), and a potential level of the sense-amplifier line SA may be slightly lowered as shown in FIG. 10(k).

Accordingly, as shown in FIG. 9(f), a full write-back operation is performed.

As to a difference between the third method and the second method, the second method separately controls the first bit lines (BISH1, BISH2), thus two lines on which the bit line cutoff-signals. (BISH1, BISH2) are applied are additionally needed. However, the third method controls the bit line cut-off signals (BISH1, BISH2) with one line, and simultaneously performs a full write-back operation.

After that, the fifth, sixth, and seventh NMOS transistors (MN5, MN6, MN7) comprising the bit line equalization unit 4 is turned on by enabling the bit line equalization signal BLP as shown in FIG. 10(e), thereby interconnecting the sense-amplifier lines (SA, /SA) as shown in FIG. 9(g). At this time, these lines (SA, /SA) have a half Vcc voltage according to a voltage division. Then, as shown in FIG. 9(h), a precharge operation is performed.

That is, as shown in FIGS. 10(c)–10(d), the 10th NMOS transistor MN10 comprising the third line connector 31 and the 11th NMOS transistor MN11 comprising the fourth line connector 32 are turned on by enabling the bit line cut-off signals (BISL1, BISL2), thereby interconnecting the second bit lines (BITL, /BITL) and the sense-amplifier lines (SA, /SA). As shown in FIG. 10(f), the fourth NMOS transistor MN4 comprising the bit line precharge unit 10 is turned on by enabling the bit line precharge signal CON_VBLP, thereby a bit line precharge voltage VBLP is applied to the first and second bit lines (BITH, /BITH, BITL, /BITL) and the sense-amplifier lines (SA, /SA).

At this time, since the sense-amplifier lines (SA, /SA) and the first bit lines (BITH, /BITH) are at a half Vcc level, if the bit line precharge voltage VBLP is applied to the lines (BITH, /BITH, BITL, /BITL, SA, /SA), there is no power-consumption.

Figure 11:
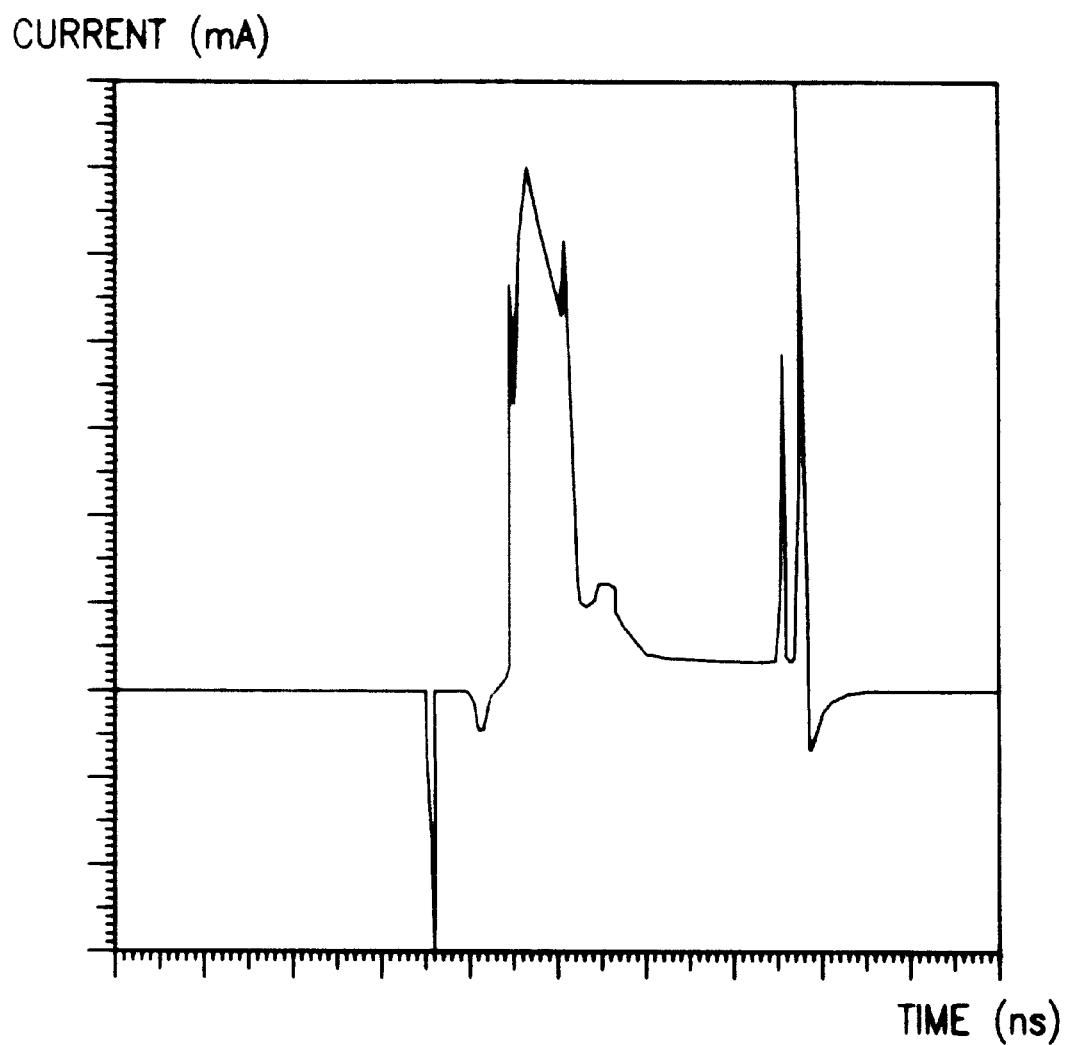
FIG. 11 shows a magnitude of a current measured at a ground terminal in the bit line sense-amplifier of the first method.
Figure 12:
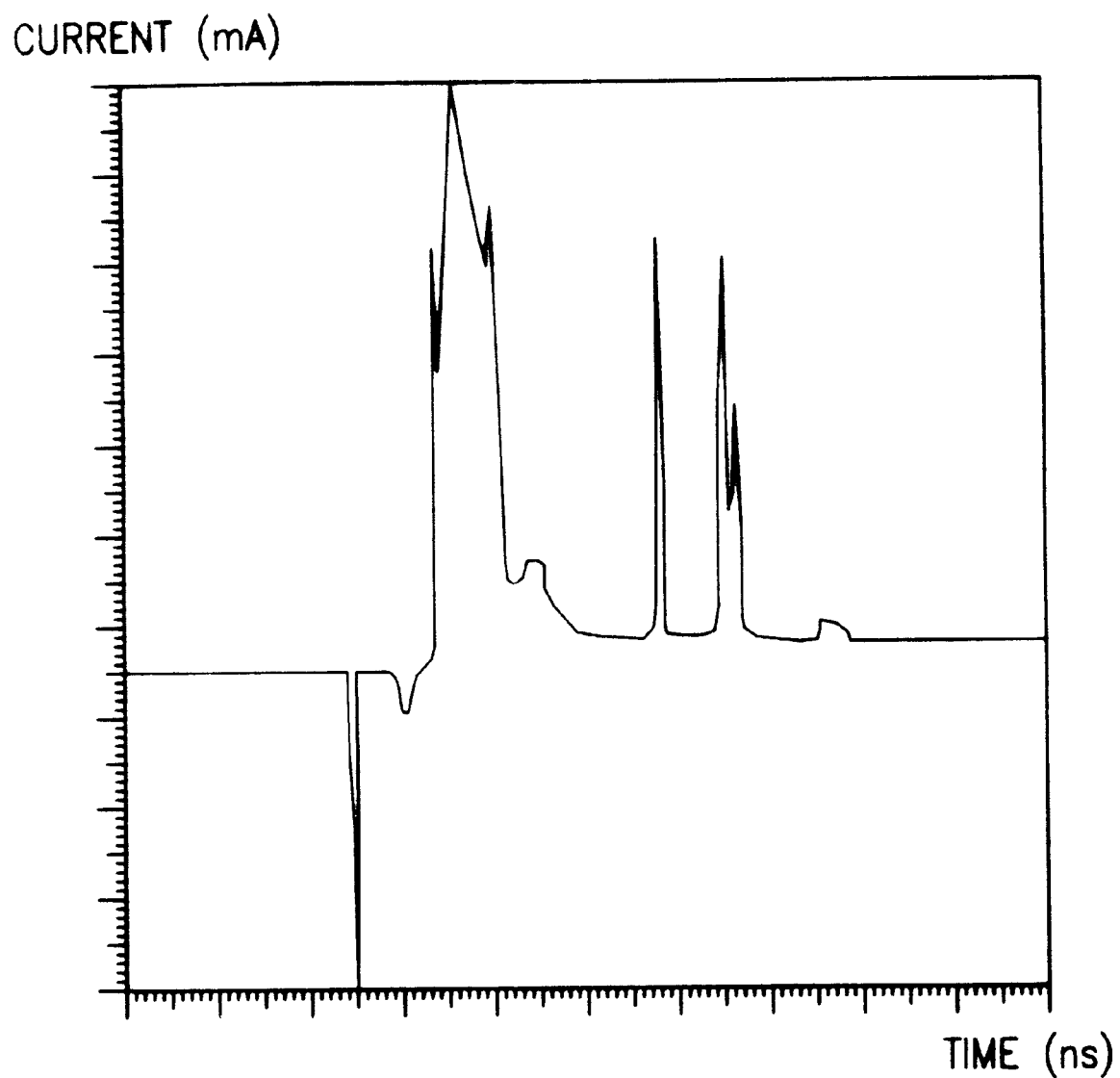
FIG. 12 shows a magnitude of a current measured at a ground terminal in the bit line sense-amplifier of the second method.
Figure 13:
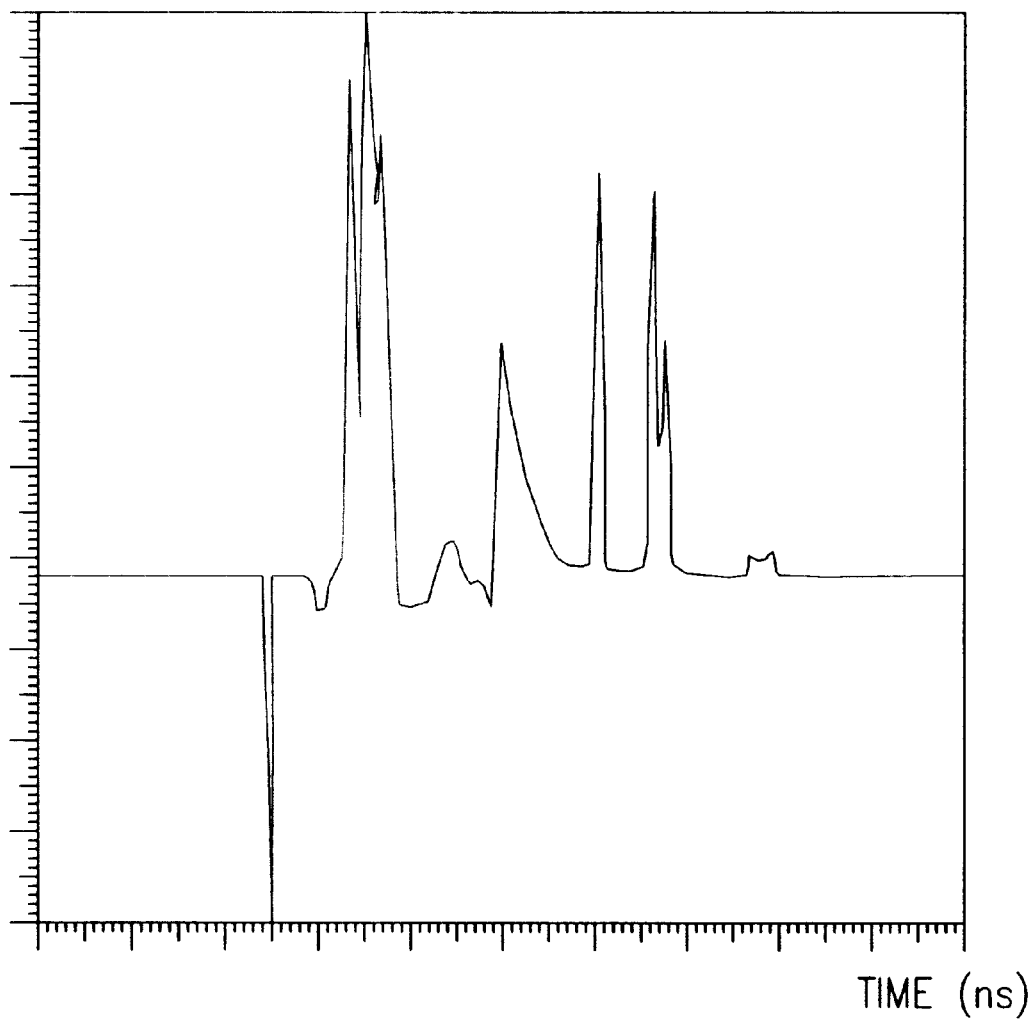
FIG. 13 shows a magnitude of a current measured at a ground terminal in the bit line sense-amplifier of the third method.
Figure 14:
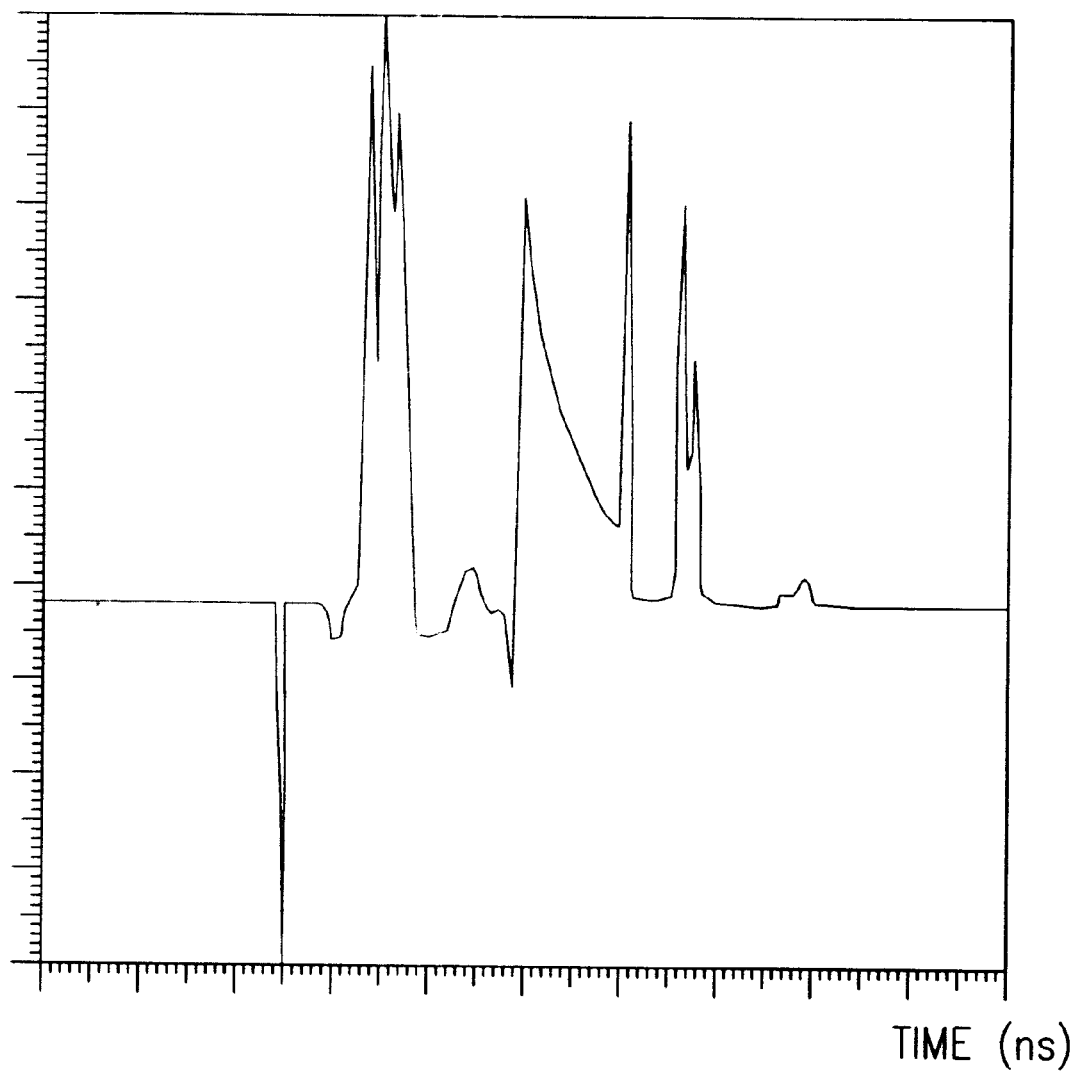
FIG. 14 shows a magnitude of a current measured at a ground terminal in the bit line sense-amplifier of the conventional art.

FIG. 11 shows a magnitude of a current measured at a ground terminal Vss in the bit line sense-amplifier of the first method; FIG. 12 shows a magnitude of a current measured at a ground terminal Vss in the bit line sense-amplifier of the second method; FIG. 13 shows a magnitude of a current measured at a ground terminal Vss in the bit line sense-amplifier of the third method; and FIG. 14 shows a magnitude of a current measured at a ground terminal Vss in the bit line sense-amplifier of the conventional art.

Referring to FIGS. 11–14, as to each average current magnitude of the first to third methods and the conventional art, an average current magnitude of the conventional art is 0.43648 mA, an average current magnitude of the first method is 0.43528 mA, an average current magnitude of the second method is 0.30721 mA, and an average current magnitude of the third method is 0.39230 mA. In conclusion, the second method is the most effective method in the light of a power-consumption.

Since each of four bit line cut-off signals is separately constructed in the bit line sense-amplifier circuit according to the present invention, each four bit line cut-off signal is separately described in the first method and the third method. But, in fact, the present invention achieves a simultaneous control by using only two lines on which a bit line cut-off signals is applied.

In the sense-amplifier control signals (RTO, /S), the present invention performs a precharge operation after completing an equalization to a precharge voltage, thereby reducing a power-consumption like as a precharge of a sense-amplifier line.

As described above, the present invention reduces a power-consumption by performing a precharge operation after completing an equalization operation, increases a sensing speed by separating the bit lines from the sense-amplifier lines in a sensing operation, and reduces a bouncing of a power-line by restraining a transient current.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. A bit line sense amplifier for a semiconductor memory device, comprising:
    first and second bit lines respectively having two bit lines, for transmitting a stored data to a memory cell;
    sense-amplifier lines for transmitting a data loaded on the first bit line to a sense-amplifier;
    first and second switch means which are controlled by first and second control signals, and selectively connect two bit lines of the first bit line to the sense-amplifier lines;
    third and fourth switch means which are controlled by third and fourth control signals, and selectively connect two bit lines of the second bit line to the sense-amplifier lines; and
    a fifth switch means which is controlled by a fifth control signal, and selectively applies a bit line precharge voltage to the sense-amplifier lines;
    said first, second, third, fourth and fifth switch means being comprised of NMOS transistors having respective gates for receiving said first, second, third, fourth and fifth control signals.

2. The bit line sense amplifier as set forth in claim 1, wherein said fifth switch means includes:
    equalization means for equalizing the sense-amplifier lines responsive to an equalizing control signal; and
    precharge means for precharging the sense-amplifier lines with said bit line precharge voltage, said precharge means being controlled by a precharge control signal separate from said equalizing control signal.

3. The bit line sense amplifier as set forth in claim 2, wherein said equalization means includes a plurality of NMOS transistors.

4. The bit line sense amplifier as set forth in claim 2, wherein said precharge means includes an NMOS transistor.

5. In a semiconductor memory device including: first and second bit lines respectively having two bit lines, for transmitting a stored data to a memory cell; a sense-amplifier line having two lines, for transmitting a data loaded on the first bit line to a sense-amplifier; first switch means for selectively connecting the first bit line to the sense-amplifier line; second switch means for selectively connecting the sense-amplifier line to the second bit line; and third switch means for selectively applying a bit line precharge voltage to the sense-amplifier line, a method for driving a bit line sense-amplifier, comprising the steps of:
    (a) interconnecting first and second bit lines and sense-amplifier line, and applying a bit line precharge voltage to the sense-amplifier line;
    (b) separating the second bit line from the sense-amplifier line, and separating the sense-amplifier line from the bit line precharge voltage;
    (c) selecting a desired memory cell, and transmitting a data to the bit lines and the sense-amplifier line by a voltage division;
    (d) sensing a data transmitted to the sense-amplifier line by a sense-amplifier, and performing a write-back operation to the selected memory cell;
    (e) performing an equalization by interconnecting two lines of the sense-amplifier line; and
    (f) connecting the data lines to the sense-amplifier line, and applying the bit line precharge voltage to the sense-amplifier line.

6. In a semiconductor memory device including: first and second bit lines respectively having two bit lines, for transmitting a stored data to a memory cell; a sense-amplifier line having two lines, for transmitting a data loaded on the first bit line to a sense-amplifier; first switch means for selectively connecting the first bit line to the sense-amplifier line; second switch means for selectively connecting the sense-amplifier line to the second bit line; and third switch means for selectively applying a bit line precharge voltage to the sense-amplifier line, a method for driving a bit line sense-amplifier for the semiconductor memory device, comprising the steps of:
    (g) interconnecting first and second bit lines and sense-amplifier line, and applying a bit line precharge voltage to the sense-amplifier line;
    (h) separating the second bit line from the sense-amplifier line, and separating the sense-amplifier line from the bit line precharge voltage;
    (i) selecting a desired memory cell, and transmitting a data to the first bit line and the sense-amplifier line by a voltage division;
    (j) separating the first bit line from the sense-amplifier line;
    (k) sensing a data transmitted to the sense-amplifier line;
    (l) connecting one line of the first bit line connected to the selected cell to one line of the sense-amplifier line, and performing a write-back operation;
    (m) interconnecting two lines of the sense-amplifier line under the condition that one line of the first bit line connected to the selected cell is only connected to one line of the sense-amplifier line, and performing an equalization operation; and
    (n) connecting the other line of the first bit line to the other line of the sense-amplifier line, connecting the sense-amplifier line to the second bit line, and applying the bit line precharge voltage to the sense-amplifier line.

7. In a semiconductor memory device including: first and second bit lines respectively having two bit lines, for transmitting a stored data to a memory cell; a sense-amplifier line having two lines, for transmitting a data loaded on the first bit line to a sense-amplifier; first switch means for selectively connecting the first bit line to the sense-amplifier line; second switch means for selectively connecting the sense-amplifier line to the second bit line; and third switch means for selectively applying a bit line precharge voltage to the sense-amplifier line, a method for driving a bit line sense-amplifier for the semiconductor memory device, comprising the steps of:
    (o) interconnecting first and second bit lines and sense-amplifier line, and applying a bit line precharge voltage to the sense-amplifier line;
    (p) separating the second bit line from the sense-amplifier line, and separating the sense-amplifier line from the bit line precharge voltage;
    (q) selecting a desired memory cell, and transmitting a data to the first bit line and the sense-amplifier line by a voltage division;
    (r) separating the first bit line from the sense-amplifier line;
    (s) sensing a data transmitted to the sense-amplifier line;
    (t) connecting the first bit line to the sense-amplifier line, and performing a write-back operation to the selected cell;

(u) interconnecting two lines of the sense-amplifier line, and performing an equalization operation; and (v) connecting the sense-amplifier line to the second bit line, and applying the bit line precharge voltage to the sense-amplifier line.

8. A bit line sense amplifier for a semiconductor memory device, comprising:

a first bit line part having a pair of bit lines, for transmitting data to or from a memory cell;

a second bit line part having a pair of bit lines, for transmitting data to or from another memory cell;

a sense-amplifier line part having a pair of bit lines, for transmitting a data from at least one of the first bit line part and the second bit line part into a sense-amplifier, said sense-amplifier line part being connected in series to said first and second bit line parts;

first and second switch means for connecting said sense-amplifier line part with said first bit line part, each of said first and second switch means being controlled respectively by one of a first control signal and a second control signal;

third and fourth switch means for connecting said sense-amplifier line part with said second bit line part, each of said third and fourth switch means being controlled respectively by one of a third control signal and a fourth control signal;

equalization means for equalizing the pair of bit lines of the sense-amplifier line part responsive to an equalizing control signal; and precharge means for precharging the pair of bit lines of the sense-amplifier line part to a precharge voltage, said precharge means being controlled by a precharge control signal separate from said equalizing control signal.

9. The bit line sense amplifier as set forth in claim 8, wherein said equalization means includes a plurality of NMOS transistors.

10. The bit line sense amplifier as set forth in claim 8, wherein said precharge means includes an NMOS transistor.

* * * * *